(12) United States Patent
Wei et al.

(10) Patent No.: US 8,008,427 B2
(45) Date of Patent: Aug. 30, 2011

(54) SOLUBLE PHENANTHRENYL IMIDAZOLE FOR PHOTO-ELECTRICAL CONVERSION OF SOLAR CELL

(75) Inventors: Kung-Hwa Wei, Hsinchu (TW); Yao-Te Chang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/901,619

(22) Filed: Oct. 11, 2010

(65) Prior Publication Data
US 2011/0028680 A1 Feb. 3, 2011

Related U.S. Application Data

(63) Continuation-in-part of application No. 11/705,609, filed on Feb. 13, 2007, now abandoned.

(30) Foreign Application Priority Data

Dec. 7, 2006 (TW) .................................. 95145634

(51) Int. Cl.
*C08G 75/00* (2006.01)
(52) U.S. Cl. ...................................... 528/379; 528/380
(58) Field of Classification Search ................... 528/380
See application file for complete search history.

(56) References Cited

U.S. PATENT DOCUMENTS 7,368,510 B2 * 5/2008 Lee et al. ...................... 525/355
2004/0227128 A1 * 11/2004 Reuter et al. ............. 252/299.01

* cited by examiner

*Primary Examiner* — John J Figueroa
(74) *Attorney, Agent, or Firm* — Jackson IPG PLLC; Demian K. Jackson

(57) ABSTRACT

A novel material of phenanthrenyl imidazole is applied to a solar cell. A phenanthrenyl-imidazole moiety is introduced to reduce a power band of a polymer, so that a photocurrent and an optoelectrical transformation efficiency are improved. Thus, a polymer having the novel material is very suitable to be used in a solar cell to acquire a high optoelectrical transformation efficiency.

7 Claims, 15 Drawing Sheets

| Polymer molar ratio | P00 | P19 | P28 | P37 | P55 | P73 | P82 |
|---|---|---|---|---|---|---|---|
| molar fraction of M1 | 100% | 90% | 80% | 70% | 50% | 30% | 20% |
| molar fraction of M2 | 0 | 10% | 20% | 30% | 50% | 70% | 80% |

FIG.2B

|  | Mn(×10³) | Mw(×10³) | PDI | $T_d^a$(°C) | $T_g$(°C) |
|---|---|---|---|---|---|
| P00 | 11.6 | 15.6 | 1.34 | 370.1 | 40.0 |
| P55 | 11.2 | 17.8 | 1.61 | 404.5 | * |
| P73 | 7.2 | 12.2 | 1.58 | 430.2 | * |
| P82 | 7.7 | 9.9 | 1.28 | 432.2 | * |

FIG. 2C

| Polymers | Oxidation onset potential (eV) | Reduction onset potential (eV) | HOMO (eV) | LUMO (eV) | Eg (eV) |
|---|---|---|---|---|---|
| P00 | 1.0 | -0.85 | -5.4 | -3.55 | 1.85 |
| P19 | 0.95 | -0.83 | -5.35 | -3.57 | 1.78 |
| P28 | 0.90 | -0.8 | -5.30 | -3.60 | 1.70 |
| P37 | 0.85 | -0.76 | -5.25 | -3.64 | 1.61 |
| P55 | 0.81 | -0.74 | -5.21 | -3.66 | 1.55 |
| P73 | 0.80 | -0.70 | -5.20 | -3.70 | 1.50 |
| P82 | 0.75 | -0.65 | -5.15 | -3.75 | 1.40 |

FIG. 3B

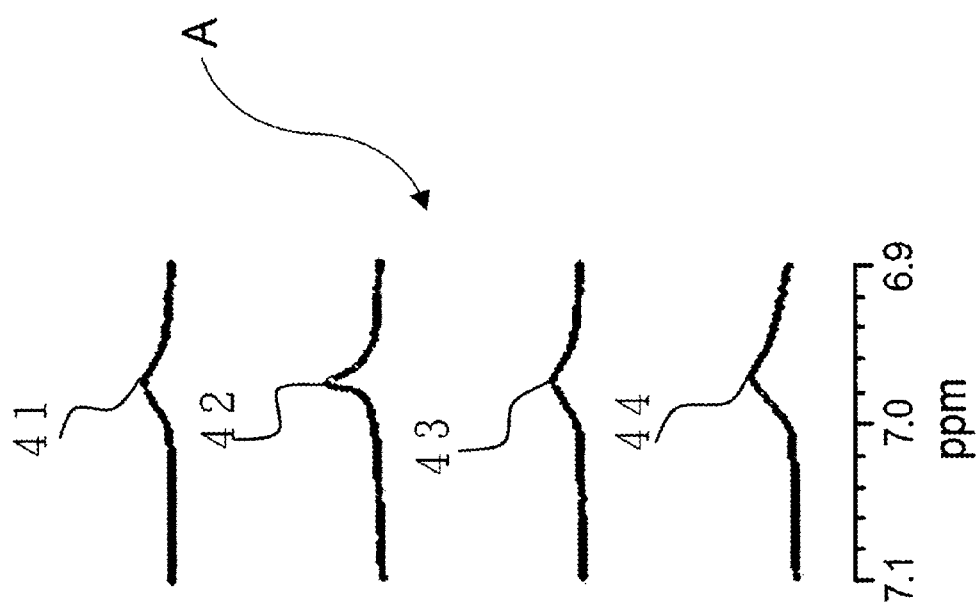

| Polymers | absorption solution (nm) | $\lambda_{max}$ film (nm) | PL solution (nm) | $\lambda_{max}$ film (nm) | optical bandgaps (eV) |
|---|---|---|---|---|---|
| P00 | 439 | 520(549,603) | 576 | 669(733) | 1.89 |
| P19 | 443 | 521(555,607) | 578 | 672(730) | 1.89 |
| P28 | 446 | 523(557,610) | 583 | 677(735) | 1.88 |
| P37 | 464 | 530(615) | 589 | 679(736) | 1.85 |
| P55 | 470 | 540(628) | 590 | 684(743) | 1.82 |
| P73 | 476 | 548(631) | 592 | 691(745) | 1.81 |
| P82 | 478 | 556(638) | 596 | 694(752) | 1.77 |

FIG.6C

| Weight ratio of polymer to PCBM | Voc (V) | Jsc (mA/cm²) | FF (%) | PCE(%) |
|---|---|---|---|---|
| P00:PCBM=1:2 | 0.59 | 10.9 | 23.6 | 1.52 |
| P37:PCBM=1:2 | 0.59 | 8.9 | 29.4 | 1.67 |
| P55:PCBM=1:2 | 0.64 | 11.8 | 30.2 | 2.10 |
| P73:PCBM=1:2 | 0.62 | 15.5 | 28.0 | 2.69 |
| P82:PCBM=1:2 | 0.69 | 17.7 | 31.1 | 3.48 |

FIG.7B

SOLUBLE PHENANTHRENYL IMIDAZOLE FOR PHOTO-ELECTRICAL CONVERSION OF SOLAR CELL

CROSS-REFERENCE TO RELATED APPLICATION

This application claims priority to under 35 U.S.C.§120 and is a continuation-in-part of pending U.S. application Ser. No. 11/705,609, filed Feb. 13, 2007, the entire contents of which are fully incorporated herein by reference.

FIELD OF THE INVENTION

The present invention relates to phenanthrenyl imidazole; more particularly, relates to a phenanthrenyl-imidazole moiety reducing a band gap of a polymer to improve a photocurrent density and an optoelectrical transformation efficiency.

DESCRIPTION OF THE RELATED ARTS

In recent years, there are a number of ways to improve power conversion efficiencies of solar cell, such as, varying annealing temperatures and time for lowering electrical resistance of devices and introducing lowered work function electrode. On the other hand, copolymerization of different conjugated monomer is investigated to change polymer structure. The material used is mainly poly-(3-hexylthiophene) (P3HT) to improve hot treatment and structure. In addition, an electron transferring moiety is introduced to a main chain of thiophene to obtain a better conjugated polymer. Therein, P3HT has an average photocurrent density of 10 mA/cm$^2$; and a highest photocurrent density is 12 mA/cm$^2$. However, the material is insufficient and the photocurrent density is still low. Hence, the prior arts do not fulfill users' requests on actual use.

SUMMARY OF THE INVENTION

The main purpose of the present invention is to reducing a band of poly(3-octyl-thiophene) (P3OT) and to improve its transference capacity.

To achieve the above purpose, the present invention is a soluble phenanthrenyl imidazole for photo-electrical conversion of a solar cell, where a first monomer and a second monomer, having phenanthrenyl imidazole, are obtained through syntheses and then are polymerized to obtain a thiophene polymer of phenanthrenyl imidazole through a Grignard metathesis (GRIM), having a chemical structure of

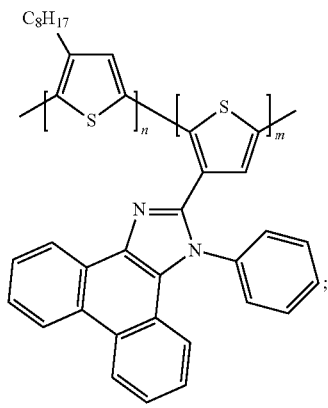

the first monomer is 2,5-dibromo-3-octylthiophene; the second monomer is 2,5-dibromo-phenanthrenyl imidazole thiophene; and the GRIM has a maximum adding ratio of 80% of the second monomer and 20% of the first monomer. Accordingly, a novel soluble phenanthrenyl imidazole for photo-electrical conversion of a solar cell is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is the view showing the syntheses of the monomers;

FIG. 2A and FIG. 2B are the views showing the GRIM;

FIG. 2C is an example of the process for deriving the values of m and n;

FIG. 3B is the view showing the measurement obtained through the cyclic voltammeter;

FIG. 4B is the enlarged view showing the absorption peaks;

FIG. 6C is the view showing the maximum wavelength and the optical band for the polymer;

FIG. 7B is the view showing the transformation ratios of the polymer solar cell.

DESCRIPTION OF THE PREFERRED EMBODIMENT

The following description of the preferred embodiment is provided to understand the features and the structures of the present invention.

The present invention is a soluble phenanthrenyl imidazole for photo-electrical conversion of a solar cell, where a first monomer and a second monomer, which has phenanthrenyl imidazole, are obtained through syntheses; and then are polymerized through a Grignard metathesis (GRIM) to obtain a thiophene polymer of phenanthrenyl imidazole having a chemical structure of

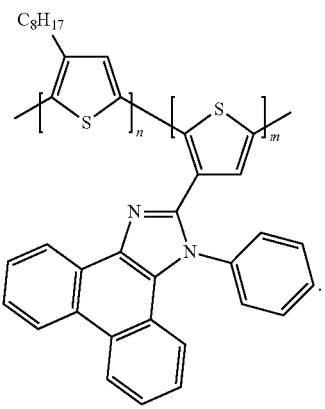

Figure 1:
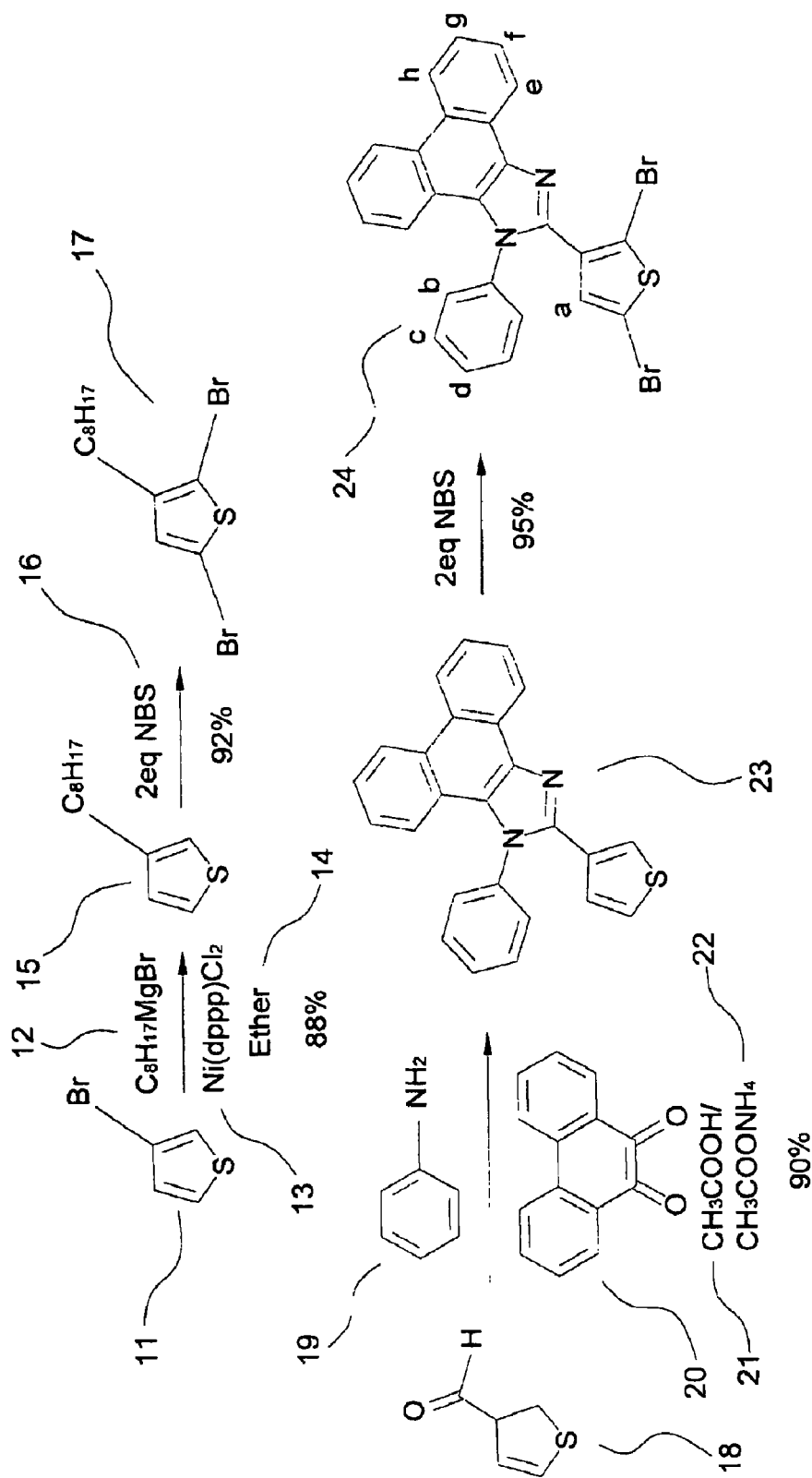
Figure 2A:
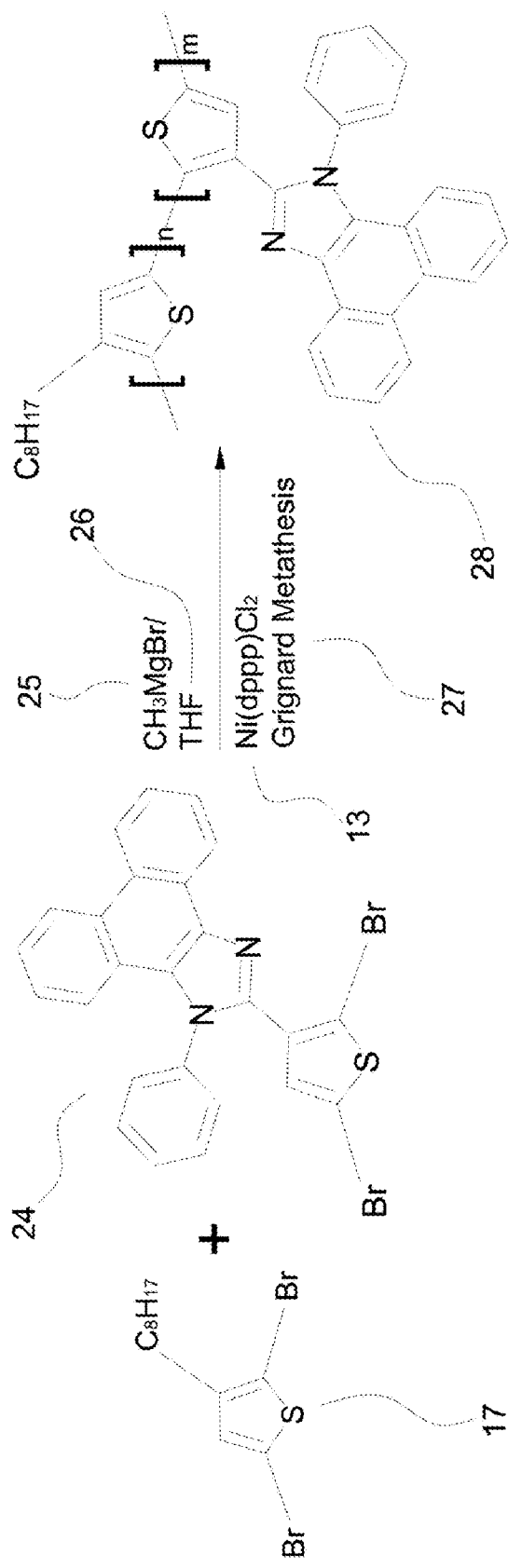

Please refer to FIG. 1, FIG. 2A and FIG. 2B, which are a view showing syntheses of monomers; and views showing GRIM. As shown in the figure, a thiophene polymer of phenanthrenyl imidazole according to the present invention is made through the following steps:

(a) 3-bromothiophene [11] and $C_8H_{17}MgBr$ [12] are reacted to obtain a first product [15], coordinated with a catalyzer (Ni(dppp)Cl$_2$) [13] and ether [14], where the first product [15] is 3-octyl-thiophene and has a production ratio of 88%.

(b) The first product [15] and two equivalent N-bromosuccinimide (NBS) [16] are reacted to obtain a first monomer [17], where the first monomer [17] is poly(3-octyl-thiophene) (P3OT) and has a production ratio of 92%.

(c) thiophene-3-carboxaldehyde [18], aniline [19] and phenanthrenequinone [20] are reacted to obtained a second product [23] with an acetic acid ($CH_3COOH$) [21] as a solvent for ammonium acetate ($CH_3COONH_4$) [22], where the second product [23] is 1-Phenyl-2-(3-thioenyl)-1 H-phenanthro-dimidazole and has a production ratio of 90%.

(d) The second product [23] and two equivalent NBS [16] are reacted to obtain a second monomer [24] having a phenanthrenyl-imidazole moiety, where the second monomer [24] is phenanthrenyl imidazole thiophene and has a production ratio of 95%; and the functionality of phenanthrenyl-imidazole moiety is similar to oxidiazo-moiety, triazole-moiety, quinoxaline-moiety, imidazole-moiety or triazine-moiety (e) And then, $CH_3MgBr$ [24] is obtained as a solvent for polymerizing the first monomer [17] and the second monomer [24] through a GRIM to obtain a thiophene polymer of phenanthrenyl imidazole [28], where the GRIM has a maximum adding ratio of 80% of the second monomer and 20% of the first monomer.

EXAMPLE

Preparing a Monomer Having a Structure of ITO/PEDOT:PSS/Polymers: PCBM(1:2, w/w)/Ca/Al An indium tin oxide (ITO) glass is precleaned with oxygen plasma prior to use. A polymer/PCBM([6,6]-phenyl C61-butyric acid methyl ester) is solved into a dichlorobenzene solution to 15 mg/mL at 40 Celsius degrees; and then is spin-coated with a thickness of 80 nanometers (nm) on the ITO glass at 1500 rpm. Calcium and aluminum are vacuum-deposited under a pressure below $10^{-6}$ torr, having a thickness of 30 nm and 100 nm respectively. Thus, a device having a material of phenanthrenyl imidazole is obtained.

The variable m and n shown in FIG. 2A are as follows. Preferably n is equal to about 7 to about 60 and m is preferably equal to about 0 to about 20. FIG. 2C is an example of the process for deriving the remaining values of m and n.

An example of the derivation of P00 follows. The Mn is 11600, as shown in FIG. 2C above. The molecular weight of M1 is 196.3 after the dibromo group is removed. The number of the repeat unit is obtained from the Mn divided by the molecular weight and is about 59. Therefore, the value of n for P00 is in the range of 55 to 60 when variations in the foregoing are taken into consideration. In the same way, the value of n and m for P55 is divided by the molecular weight of M1 and M2 which are 196 and 372, respectively. Therefore, the number of the molecular weight is 11200. For 50% of M1 and 50% of M2, the value of n is about 25 to 30 and the value of m is about 16 to 18. It is believed that further details are not necessary because the skilled artisan would understand how to derive these values in view of the disclosure contained herein.

Figure 3A:
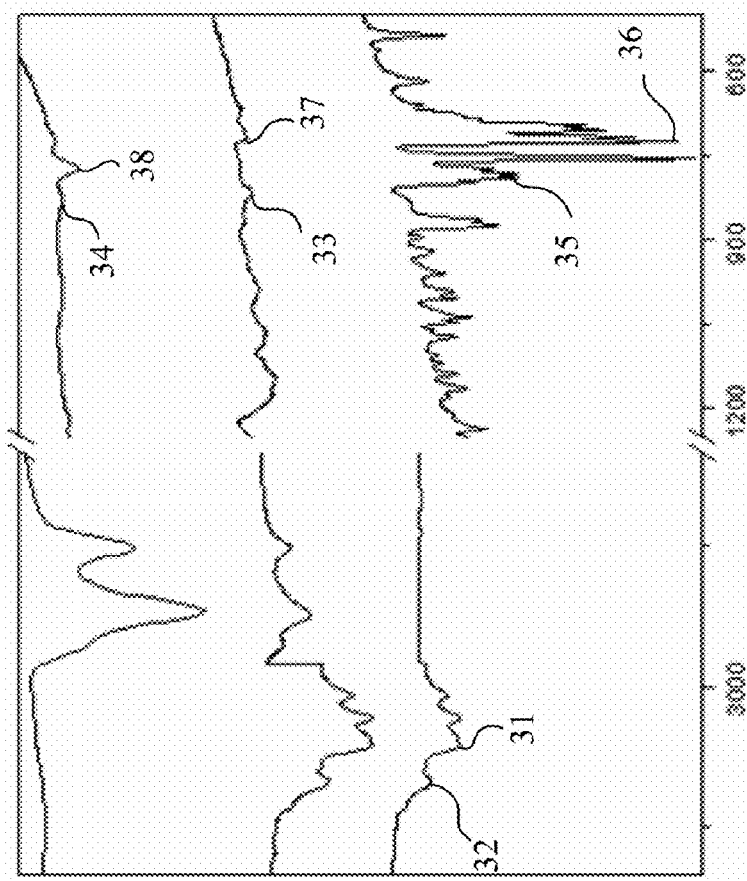
FIG. 3A is the view showing the spectra obtained through the FTIR.

Please further refer to FIG. 3A and FIG. 3B, which are views showing spectra obtained through an Fourier Transform InfraRed spectroscopy (FTIR) and a measurement obtained through a cyclic voltammeter. As shown in FIG. 3A, a second monomer and a synthesized polymer are measured through an FTIR. And it shows that sharp absorption bands at 3067 cm$^{-1}$ and 3127 cm$^{-1}$ for the second monomer is corresponding to β-CH stretching absorption of the thiophene. Curve at 820 cm$^{-1}$ for P00 [34] and P37 [33] are corresponding to CH out-of-plane deformation absorption. In the other hand, a curve at 783 cm$^{-1}$ [35] for the second monomer is corresponding to α-CH bending absorption, which is absent at 783 cm$^{-1}$ for P00 and P37. P37 has a long chain of $CH_3$-$CH_2$ between 2800 and 3000 cm$^{-1}$. And curves at 727 cm$^{-1}$ for the second monomer [36], P00 [38] and P37 [37] have deformation absorptions corresponding to C—S—C ring. Thus, phenanthrenyl-imidazole moiety changes highest occupied molecular orbitals (HOMO) and lowest unoccupied molecular orbitals (LUMO). As shown in FIG. 3B, the HOMO and the LUMO are obtained by the following formula:

$E^{HOMO} = -E^{ox} - 4.4$ eV and $E^{LUMO} = -E^{red} - 4.4$ eV and where $E^{ox}$ and $E^{red}$ are the onset potentials of the oxidation and reduction peaks. A band gap exists between the $E^{HOMO}$ and the $E^{LUMO}$. After introducing the phenanthrenyl-imidazole moiety, the HOMOs for P00 to P82 are increased from −5.40 electron volts (eV) to −5.15 eV; and the LUMOs are decreased from −3.75 eV to −3.55 eV. Thus phenanthrenyl-imidazole moiety increases effective conjugation length of polymers like P00 and P82 by improving coplanarity.

Figure 4A:
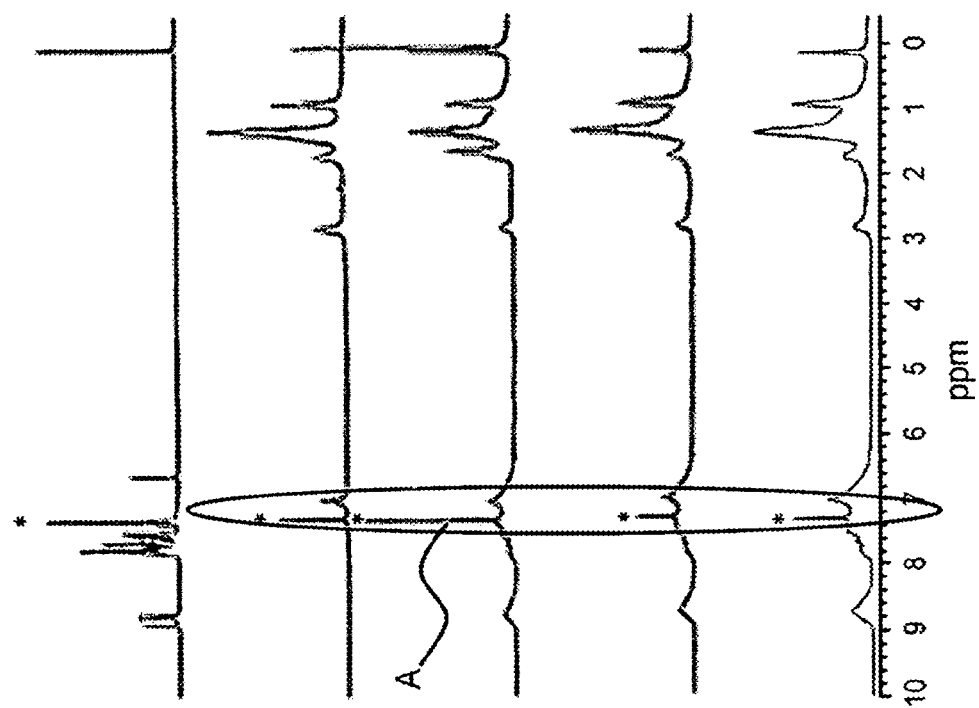
FIG. 4A is the view showing the spectra obtained through the NMR.

Please further refer to FIG. 4A and FIG. 4B, which are a view showing spectra obtained through Nuclear Magnetic Resonance (NMR) and an enlarged view showing absorption peaks. As shown in spectra obtained through NMR, absorption peaks at 6.98 ppm for P00 [41], P37 [42], P55 [43], P82 [44] show regio-regularity. In the NMR figure for the polymers, only 6.98 ppm peak and no other peak nearby in the spectra shows that the polymers possess a high head-to-tail configuration. The second monomer contributes absorptions at 7.2 ppm~8.2 ppm and 8.2 ppm~9.2 ppm; and the first monomer contributes an absorption at 0.3 ppm~3.0 ppm.

Figure 5A:
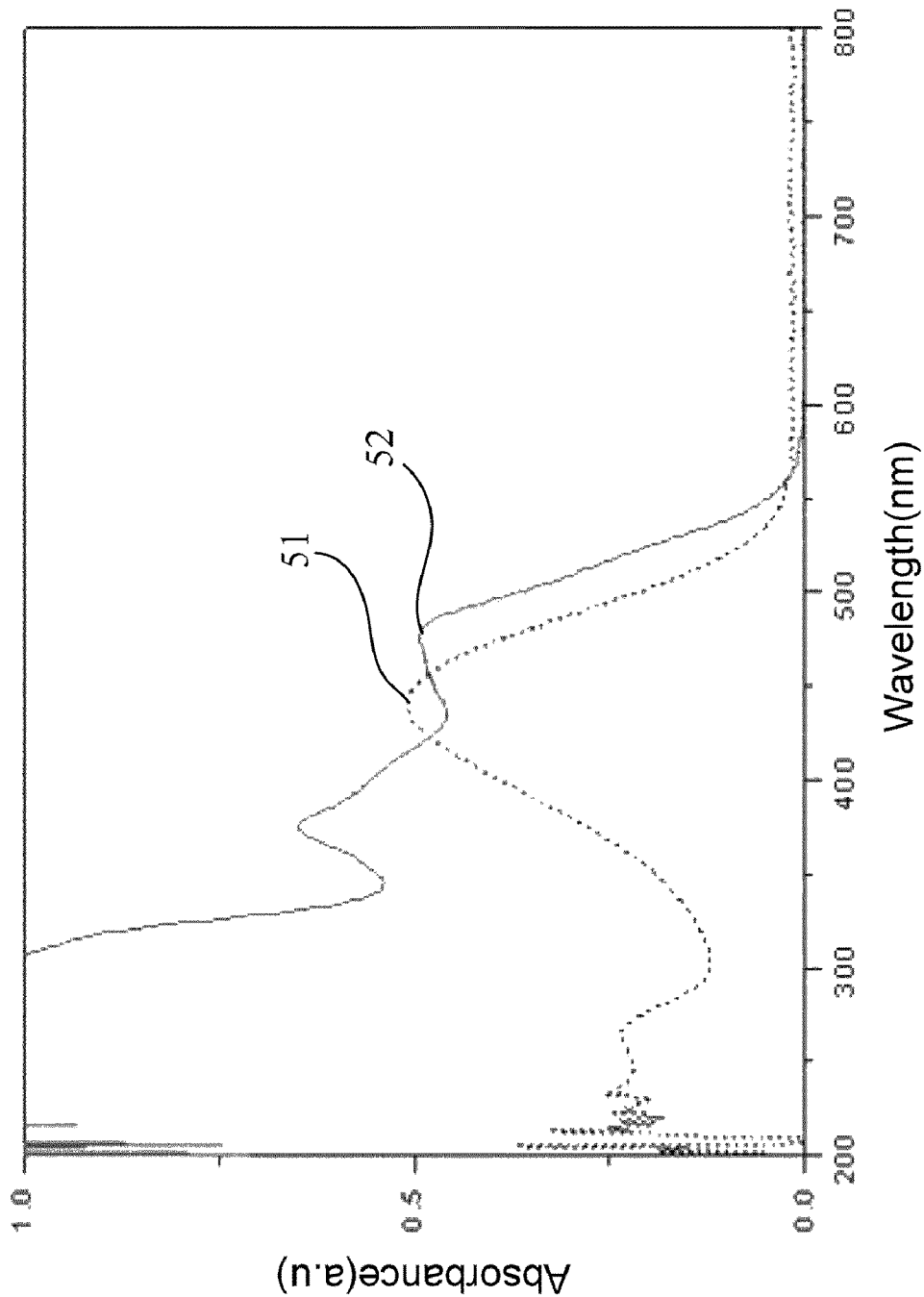
FIG. 5A is the view showing spectra of ultraviolet-visible light for the polymer in the liquid state.
Figure 5B:
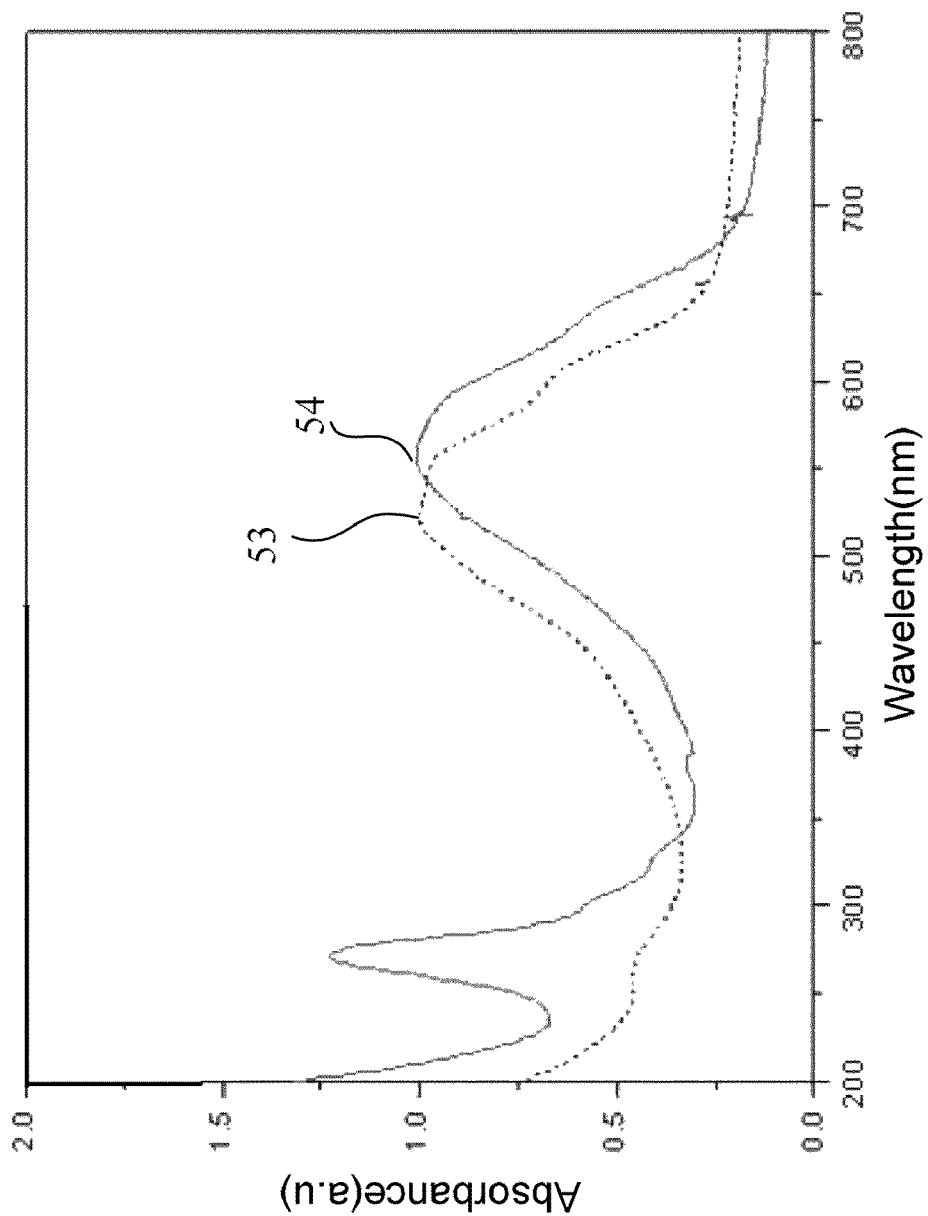
FIG. 5B is the view showing the spectra of ultraviolet-visible light for the polymer in the solid state.

Please further refer to FIG. 5A and FIG. 5B, which are views showing spectra of ultraviolet-visible light for the polymers in a liquid state and in a solid state. As shown in the figures, maximum absorptions in a liquid state increases from 439 nm [51] to 478 nm [52]; and maximum absorptions in a solid state increases from 520 nm [53] to 556 nm [54]. Thus it shows band of the copolymer has an obvious decrease.

Figure 6A:
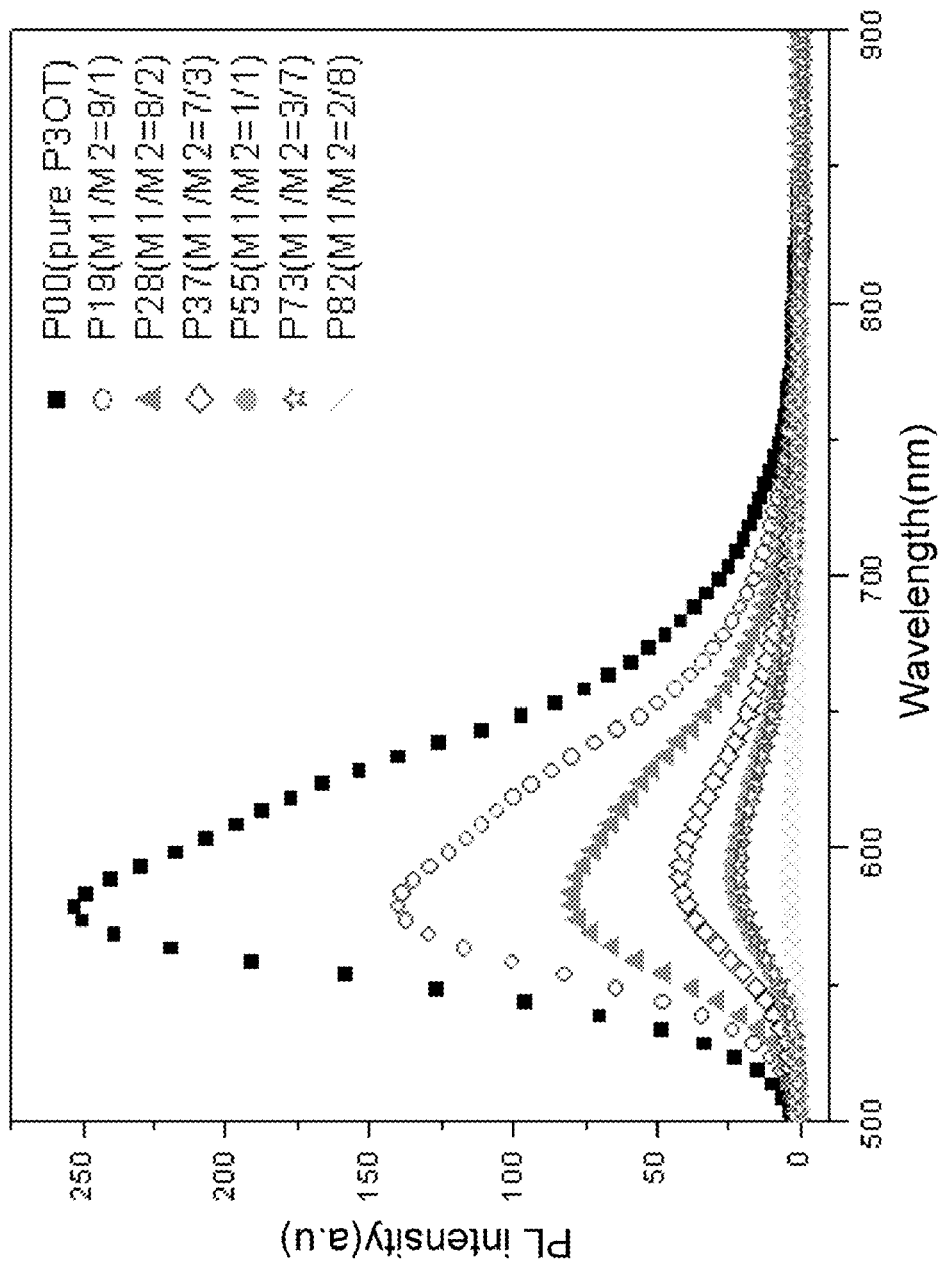
FIG. 6A is the view showing the PL intensity for the polymer in the liquid state.
Figure 6B:
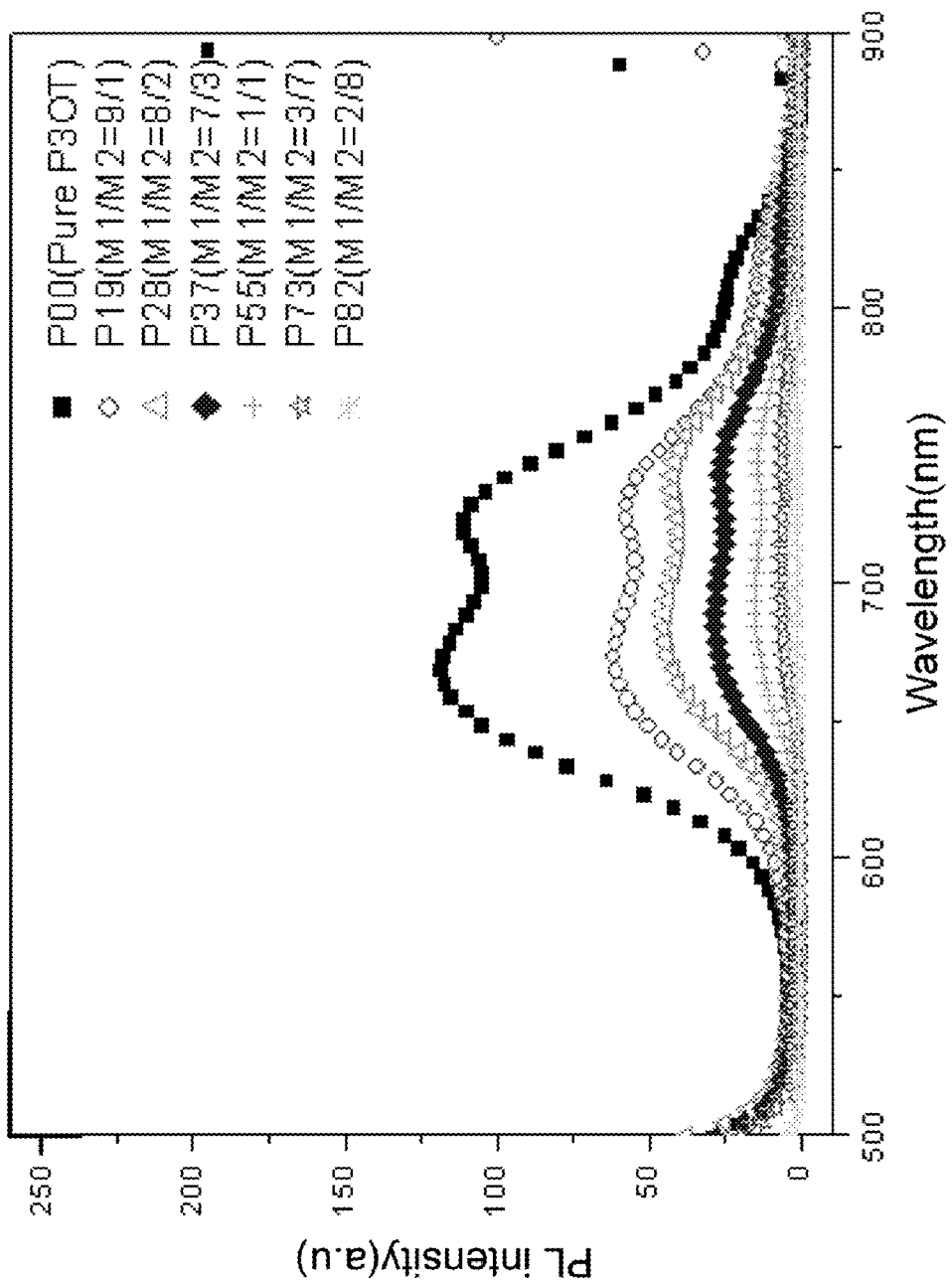
FIG. 6B is the view showing the PL intensity for the polymer in the solid state.

Please further refer to FIG. 6A, FIG. 6B and FIG. 6C, which are views showing photoluminescence (PL) intensities for polymers in liquid state and in solid state and a view showing a maximum wavelength and an optical band for the polymer. As shown in the figures, after introducing phenanthrenyl-imidazole moiety, PL intensities for polymers decrease as amounts of phenanthrenyl-imidazole moiety increase. It shows, after main chain of a polymer is photo-excited, electric charges are transferred by the phenanthrenyl-imidazole moiety to increase photo-guiding charge transfer or energy transfer; charge transfer is rapid enough to compete with recombination of the electrons and holes; and thus the PL intensity is decreased. As shown in FIG. 6C, values for maximum absorption wavelength and optical band are obtained. By introducing phenanthrenyl-imidazole moiety, conjugation length of the polymer is increased so that the maximum absorption wavelength is increased from 520 nm to 556 nm and the optical band is reduced from 1.89 eV to 1.77 eV.

Figure 7A:
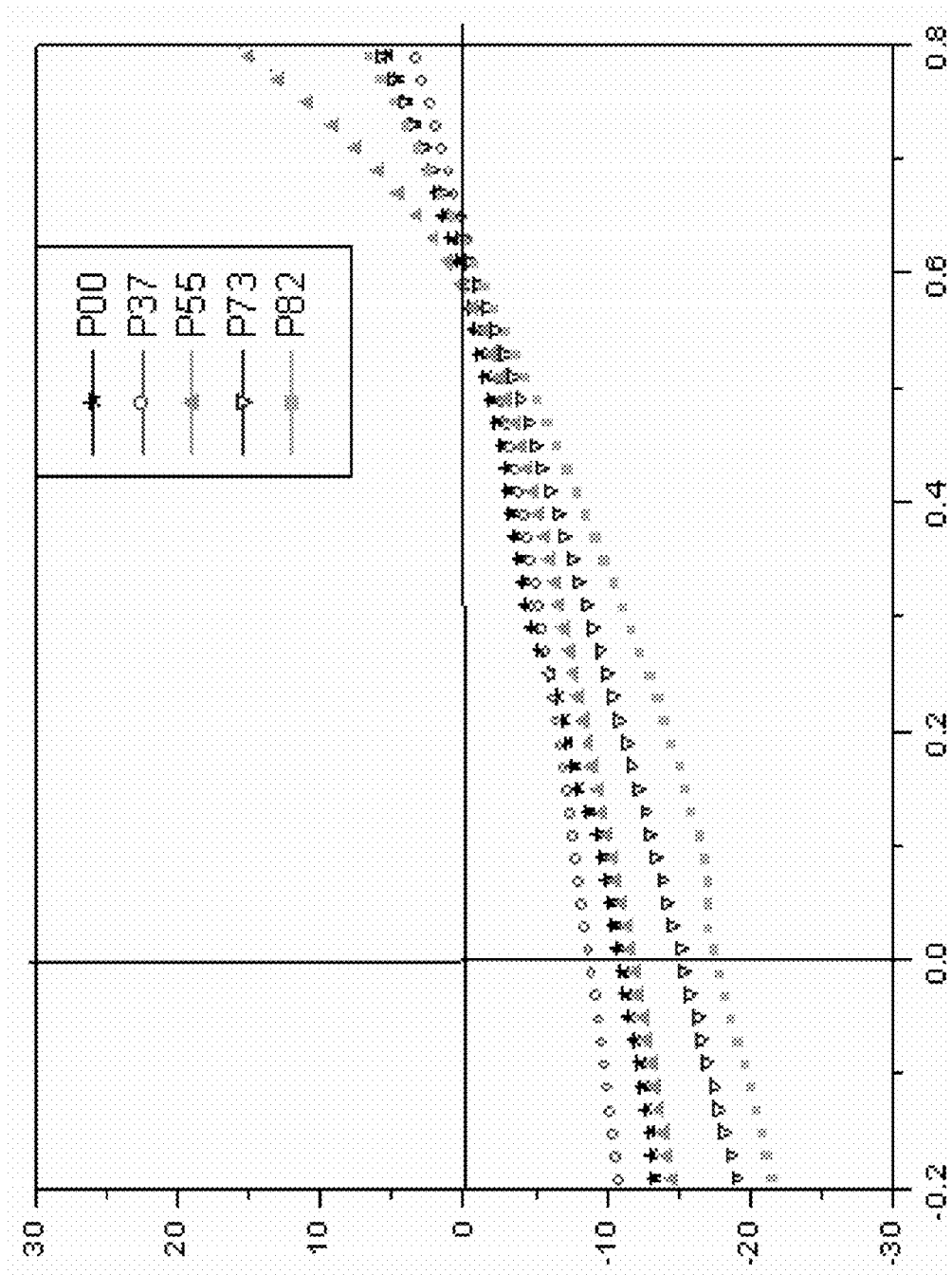
FIG. 7A is the view showing the photocurrents of the solar cell.

Please refer to FIG. 7A and FIG. 7B, which are a view showing photocurrents of a solar cell; and a view showing transformation ratios of the solar cell. As shown in the figures, a solar cell is prepared, which has a structure of ITO/PEDOT:PSS/Polymers:PCBM(1:2,w/w)/Ca/Al. The solar cell is measured for its photocurrent. Therein, following the increase in amount of the phenanthrenyl-imidazole moiety, photocurrent intensities are greatly increased from 10.9 mA/cm$^2$ to 17.7 mA/cm$^2$; open circuit voltages (Voc), from 0.59 volts (V) to 0.69V; fill-factors (FF), from 23.6% to 31.1%; and, maximum power conversion efficiency, from 1.52% to 3.48%, corresponding to P00 to P82 respectively. The open circuit voltage of the solar cell is influenced by not only a difference between LUMO of the electron acceptor and HOMO of the electron donor but also the FF. The lower Voc means better miscibility and interaction between the polymer and PCBM. Short circuit is increased with the introduction amount of the phenanthrenyl-imidazole moieties due to the increasing of the electron mobility of the copolymers. The FFs are low due to thick films, short drift length of excitons, or great inner resistance. The power conversion efficiency increases from 1.52% for P00 to 3.48% for P82 owing to the higher electron mobility of P82 than that of P00. Therefore, the present invention shows that the introduction of the phenanthrenyl-imidazole moieties onto the copolymer are promising polymer materials for application in solar cells.

To sum up, the present invention is a soluble phenanthrenyl imidazole for photo-electrical conversion of a solar cell, where a current density of a solar cell is greatly improved while a high photoelectrical transformation ratio remains; and thus a breakthrough happens to a solar cell promising a better efficiency in photoelectrical transformation.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A soluble phenanthrenyl imidazole for photo-electrical conversion of a solar cell, wherein a first monomer and a second monomer are obtained through syntheses and then are polymerized to obtain a thiophene polymer of phenanthrenyl imidazole through a Grignard metathesis (GRIM), said second monomer having phenanthrenyl imidazole, said thiophene polymer of phenanthrenyl imidazole having a chemical structure of

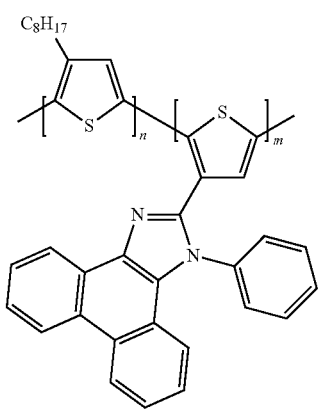

wherein n=7-60 and m=0-20.

2. The phenanthrenyl imidazole according to claim 1, wherein said thiophene polymer of phenanthrenyl imidazole is obtained through steps of:

(a) obtaining a first product through a reaction of a bromophenol and C$_8$H$_{17}$MgBr while being coordinated with a catalyzer and an ether, said catalyzer being Ni(dppp)Cl$_2$;

(b) obtaining said first monomer from said first product and N-bromosuccinimide (NBS);

(c) obtaining a second product through a reaction of 3-formylthiophene, phenanthrenequinone and aniline while having an acetic acid as a solvent for ammonium acetate;

(d) obtaining said second monomer from said second product and NBS; and (e) processing a polymerization of said first monomer and said second monomer through said GRIM to obtain said thiophene polymer of phenanthrenyl imidazole.

3. The phenanthrenyl imidazole according to claim 1, wherein said first monomer is 2,5-dibromo-3-octyl-thiophene, having a chemical structure of

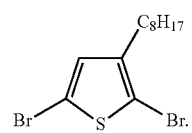

4. The phenanthrenyl imidazole according to claim 1, wherein said second monomer is 2,5-dibromo-phenanthrenyl imidazole thiophene, having a chemical structure of

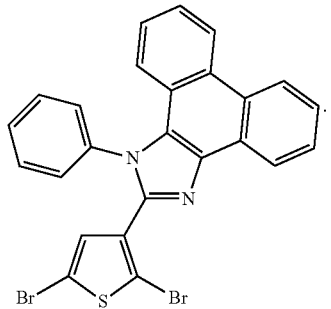

5. The phenanthrenyl imidazole according to claim 1, wherein said second product is 1-Phenyl-2-(3-thioenyl)-1 H-phenanthro-dimidazole, having a chemical structure of

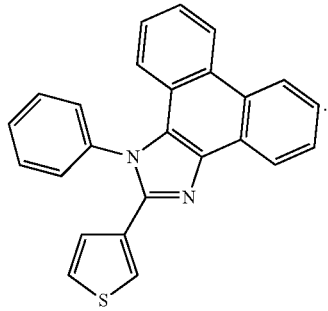

6. The phenanthrenyl imidazole according to claim 1, wherein said GRIM has a maximum adding ratio of 80% of said second monomer and 20% of said first monomer.

7. The phenanthrenyl imidazole according to claim 1, wherein said second monomer is made of a material selected from a moiety consisting of oxidiazo-moiety, triazole-moiety, quinoxaline-moiety, imidazole-moiety and triazine-moiety.

* * * * *